United States Patent
Dogiamis et al.

(10) Patent No.: US 11,715,693 B2
(45) Date of Patent: Aug. 1, 2023

(54) DIELECTRIC WAVEGUIDE CHANNEL FOR INTERCONNECTING DIES IN A SEMICONDUCTOR PACKAGE USABLE IN A COMPUTING DEVICE AND METHOD OF MANUFACTURE

(71) Applicant: Intel Corporation, Santa Clara, CA (US)

(72) Inventors: Georgios Dogiamis, Chandler, AZ (US); Aleksandar Aleksov, Chandler, AZ (US); Adel A. Elsherbini, Chandler, AZ (US); Henning Braunisch, Phoenix, AZ (US); Johanna M. Swan, Scottsdale, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 945 days.

(21) Appl. No.: 16/397,923

(22) Filed: Apr. 29, 2019

(65) Prior Publication Data

US 2020/0294940 A1 Sep. 17, 2020

(30) Foreign Application Priority Data

Mar. 15, 2019 (GR) .............................. 20190100126

(51) Int. Cl.
*H01L 23/538* (2006.01)
*H01L 23/66* (2006.01)
*G02B 6/30* (2006.01)
*H01P 3/16* (2006.01)
*H01P 11/00* (2006.01)

(52) U.S. Cl.
CPC .............. *H01L 23/538* (2013.01); *G02B 6/30* (2013.01); *H01L 23/66* (2013.01); *H01P 3/16* (2013.01); *H01P 11/006* (2013.01); *H01L 2223/6627* (2013.01)

(58) Field of Classification Search
CPC .......... H01P 3/16; H01P 11/006; H01P 3/121; H01P 5/024; H01P 5/08; H01P 5/107
USPC ........................................................... 333/26
See application file for complete search history.

(56) References Cited

U.S. PATENT DOCUMENTS

| | | | |
|---|---|---|---|
| 9,705,174 B2* | 7/2017 | Payne et al. | .............. H01P 3/16 |
| 2013/0265733 A1* | 10/2013 | Herbsommer et al. | ...................... H01P 5/107 361/774 |
| 2015/0295307 A1* | 10/2015 | Cook et al. | ........... H01P 11/006 343/905 |
| 2017/0141450 A1* | 5/2017 | Bae et al. | ............... H01P 3/122 |
| 2018/0097269 A1* | 4/2018 | Dogiamis et al. | ...... G06F 1/182 |
| 2018/0108971 A1* | 4/2018 | Connor et al. | .......... H01P 5/103 |

\* cited by examiner

*Primary Examiner* — Benny T Lee
(74) *Attorney, Agent, or Firm* — Akona IP PC

(57) ABSTRACT

Embodiments may relate to a semiconductor package that includes a package substrate coupled with a die. The package may further include a waveguide coupled with the first package substrate. The waveguide may include two or more layers of a dielectric material with a waveguide channel positioned between two layers of the two or more layers of the dielectric material. The waveguide channel may convey an electromagnetic signal with a frequency greater than 30 gigahertz (GHz). Other embodiments may be described or claimed.

16 Claims, 10 Drawing Sheets

DIELECTRIC WAVEGUIDE CHANNEL FOR INTERCONNECTING DIES IN A SEMICONDUCTOR PACKAGE USABLE IN A COMPUTING DEVICE AND METHOD OF MANUFACTURE

CROSS-REFERENCE TO RELATED APPLICATION

This application claims priority to Greek Patent Application No. 20190100126 filed Mar. 15, 2019 and entitled "Waveguide Interconnect for Packages", which is hereby incorporated by reference in its entirety herein.

BACKGROUND

Generally, packages may be interconnected with one another using a motherboard where signals may be routed through the motherboard. Alternatively, packages may be interconnected by using top-side interconnects (TSIs). However, TSI solutions may require one or more connects or sockets. However, elements in the signal path such as the TSIs, the motherboard, or the sockets may introduce some degree of attenuation of the signal.

DETAILED DESCRIPTION

Figure 1:
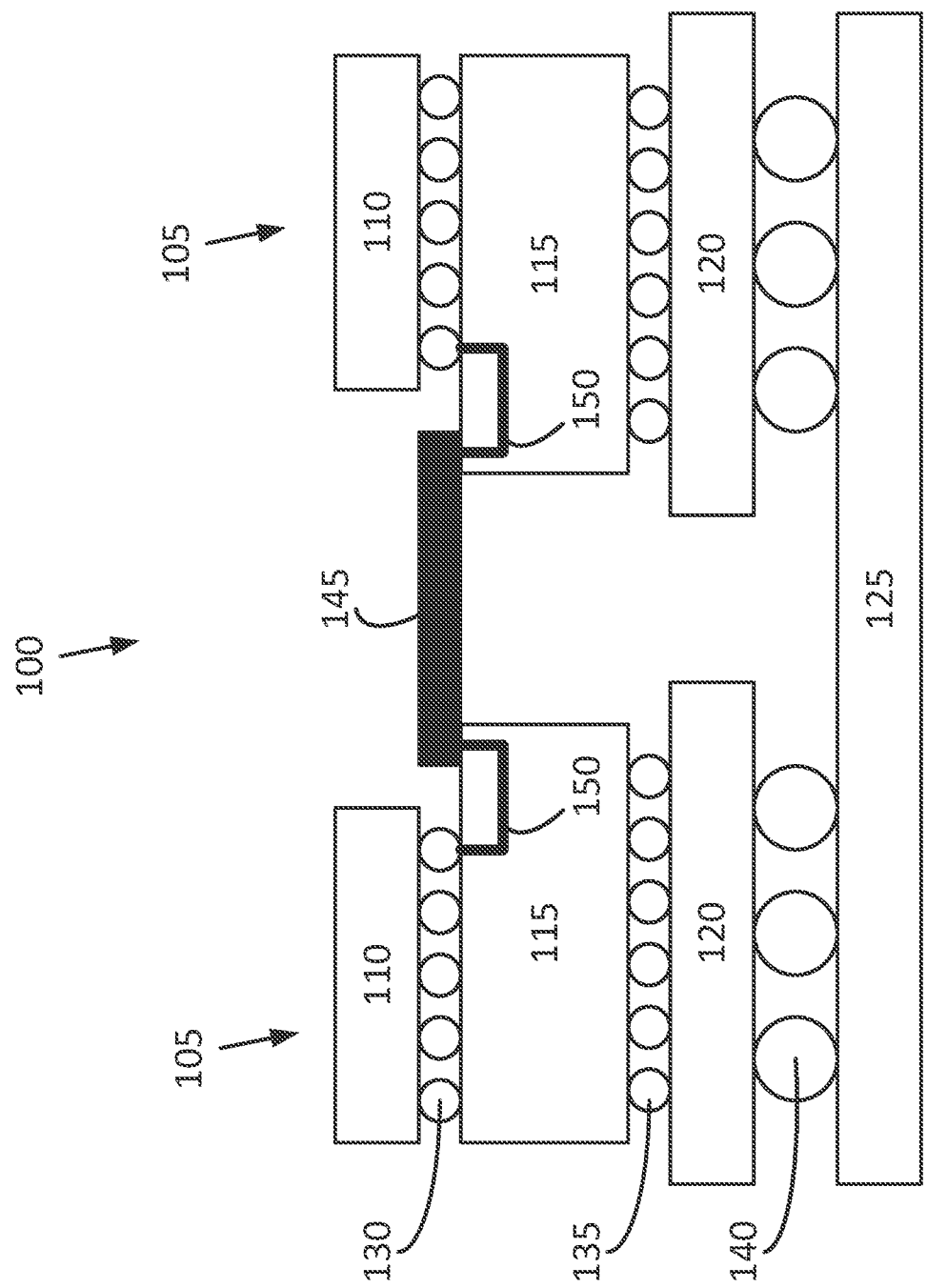
FIG. 1 depicts a simplified view of an example system with a waveguide interconnect, in accordance with various embodiments herein.

In the following detailed description, reference is made to the accompanying drawings which form a part hereof, wherein like numerals designate like parts throughout the detailed description of the drawings, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with derivatives thereof, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to the accompanying Figures. Reference numerals having numbers beginning with one hundred (e.g., 105, 130, etc.) refer to FIG. 1. Reference numerals having numbers beginning with two hundred (e.g., 245, 250, etc.) refer to FIG. 2. Reference numerals having numbers beginning with three hundred (e.g., 325, 345, etc.) refer to FIG. 3. Reference numerals having numbers beginning with four hundred (e.g., 415, 425, etc.) refer to FIGS. 4, 5, and 6. Reference numerals having numbers beginning with five hundred (e.g., 505, 530, etc.) refer to FIGS. 7 and 8. Reference numerals having numbers beginning with eleven hundred (e.g., 1100, 1105, etc.) refer to FIG. 9. Reference numerals having numbers beginning with fifteen hundred (e.g., 1502, 1512, etc.) refer to FIG. 10. A collection of reference numerals may be designated with different numerals or letters (e.g., 300*a*, 300*b*,), such a collection may be referred to herein without the numerals or letters (e.g., as "300"). Unless explicitly stated, the dimensions of the accompanying Figures are intended to be simplified illustrative examples, rather than depictions of relative dimensions. For example, various lengths/widths/heights of elements in the accompanying Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Generally, embodiments herein may relate to direct high-speed connectivity of otherwise discrete/individual packages in a computational system through waveguides (WGs) or waveguide bundles/cables. The waveguide components herein may be directly built up on a reconstituted version of the substrate panel or quarter panel. Alternatively, the waveguide components may be built-up independently and assembled on the package using attach films or socket retention. In this way, direct connectivity of packages using dielectric (or metal-coated) waveguides may be achieved, and assembly operations may be reduced. These packages may lead to lower cost or simpler systems. That way, flexible or relatively thin waveguide cables may be built-up and the need of connectorization of the waveguides may be removed. Additionally, a denser or more complex network interconnect may be achieved. More succinctly, embodiments herein may allow for a simple, precise, and low-cost way to directly connect several packages or multi-chip packages (MCPs) in a fabric while allowing for minimal disruptions in the signal path, reduction of the overall form factor, and removal of connectorization cost.

Generally, in embodiments, two or more package substrate may be spatially reconfigured and reconstituted in a "new" wafer or panel/quarter panel. Generally, the configuration of the substrate or the packages on the substrate may be based on factors such as desired system architecture, and may be encountered in server-type systems, however other embodiments may be used in non-server-type systems such as mobile applications, etc. Generally, the distance between the two packages may be on the order of approximately a tenth of an inch to approximately 10 inches. A waveguide network may then either be built on the reconstituted panel (i.e., on top of the packages), or assembled without the need of connectors (i.e., using a retention socket or adhesive film). The result may be a computational system that is interconnected using a dense waveguide fabric. Due to the manufacturing registration accuracy (which may be on the order of accuracies of less than 10 micrometers (microns)), the waveguide channels may be aligned to signal launchers of the package (or a die of the package). This alignment may result in lower-loss transitions than previously observed in legacy configurations, and may not require additional connectors which may be observed in legacy configurations. Additionally, good alignment between the packages and the waveguides may be achieved by utilizing the retention mechanism of a socket. The socket may be desirable in a variety of configurations, including configurations where pre-fabricated waveguide "flex" cables may be desired.

Embodiments herein may provide a number of advantages. For example, embodiments may not need the connector structure that may be used in legacy systems, which may lead to cost savings and increased simplicity of manufacturing. Embodiments may also not need an alignment effort between the packages and the waveguides in the case of direct build-up. The waveguide network material choice may be decoupled from the materials of the packages, and so the waveguides may include low-cost/low-loss plastic materials such as polytetrafluoroethylene (PTFE)-based materials, polyethylene (PE)-based materials, liquid-crystal polymer (LCP)-based materials, etc. The resultant interconnect may also be relatively thin or flexible as compared to legacy systems, and may provide a relatively dense interconnect because there may be little to no handling or connectorization required on the package. The packages themselves may be tested and therefore known good packages may be used, which may increase system yields. Second level interconnect (SLI) scaling may be relaxed because the resultant high-speed signals may not pass through the SLI. In addition, resultant systems may have an electrical performance advantage because there may only be transitions between the waveguide and the package using scaled design rules (DRs), which may lead to a better matching and reduced reflections at the waveguide/package interface.

FIG. 1 depicts a simplified view of an example system 100 with a waveguide interconnect, in accordance with various embodiments herein. It will be noted that each and every element of FIG. 1 may not be individually labeled and enumerated, however similarly shaped and positioned elements (such as the various interconnects) may be assumed to share characteristics of similar elements unless explicitly stated otherwise.

The system may include two or more microelectronic packages 105 that are coupled together by a waveguide 145 (which may also be referred to as a waveguide interconnect or a waveguide network). The waveguide 145 may be configured to convey one or more high-speed electromagnetic signals between the two microelectronic packages. As used herein, a "high-speed" signal (e.g., a high-speed electromagnetic or high-speed electronic signal) may refer to a signal that has a frequency above approximately 30 gigahertz (GHz). For example, the high-speed signal may be a millimeter-Wave (mmWave) signal with a frequency between approximately 30 GHz and approximately 300 GHz. Alternatively, the high-speed signal may have a frequency greater than 300 GHz, for example on the order of 1 terahertz (THz) or above. In some embodiments, the high-speed signal may have a frequency between approximately 300 GHz and approximately 10 THz. In some embodiments, the high-speed signal may be considered to be a radio frequency (RF) signal as opposed to, for example, an optical signal or some other type of electromagnetic signal. Generally, the waveguide 145 may be formed of one of the materials described above such as a PTFE-based material, a PE-based material, an LCP-based material, or some other appropriate material as will be described in greater detail below. Generally, as will be described in further detail, the waveguide 145 may be coupled with the microelectronic packages 105, for example by an adhesive.

The microelectronic packages 105 may include a die 110 coupled with a package substrate 115 by one or more interconnects 130. The die 110 may be a processor, a memory, or some other type of active element. For example, the die 110 may be or include a central processing unit (CPU), a graphics processing unit (GPU), a core of a multi-core processor, a memory such as a flash memory, or some other type of logic element. In embodiments, the die may include one or more passive elements such as a resistor, a capacitor, an inductor, etc. The die may also include one or more conductive elements such as traces, vias, pads, etc. The various active, passive, or conductive elements may be coupled with or in-between one or more layers of a dielectric material.

Similarly, the package substrates 115 may be a cored or coreless package substrate that includes one or more layers of an organic or inorganic dielectric material such as organic build-up films (BFs), silica filled epoxy resins, or some other dielectric material. The package substrates 115 may include one or more conductive elements or passive elements such as those described above. The conductive or passive elements may be coupled with, or positioned within, the package substrates 115. The package substrates 115 may also include one or more additional dies positioned within, or coupled with, the package substrates 115. These additional elements of the dies 110 and the package substrates 115 may not be depicted in FIG. 1 for the sake of clarity and conciseness.

The interconnects 130 may be some form of interconnect that physically or communicatively couples the die 110 to the package substrate 115. For example, as depicted, the interconnects 130 may be a solder ball or solder bump. For example, the solder ball may be an element of a ball grid array (BGA). In other embodiments, the interconnects 130 may be a pin of a pin grid array (PGA), an element of a land grid array, etc. In some embodiments, the interconnects 130 may be replaced by, or include, a socket, some type of mechanical clamp, or some other coupling feature.

The microelectronic packages 105 may be coupled with a socket 120. The socket 120 may be a physical feature that helps to align or physically stabilize the microelectronic packages. The socket 120 may include one or more interconnects 135, which may be similar to interconnects 130. In other embodiments, the socket may not include the interconnects 135 and may instead be physically coupled directly with the package substrate 115. It will be understood that in some embodiments the socket 120 may be considered to be optional, and may not be present. For clarity, various retention mechanisms of the socket 120, various heating solutions, etc. may not be shown in FIG. 1.

In embodiments where the socket 120 is present, the socket 120 may be coupled with a circuit board 125 by one or more interconnects 140. The interconnects 140 may be similar to other interconnects described herein such as interconnects 130. In embodiments where the socket 120 is not present, the microelectronic packages 105 may be coupled with the circuit board 125 by interconnects 135. The circuit board 125 may be, for example, similar to the package substrate 115 in that it may be cored or coreless and include one or more organic or inorganic layers of a dielectric material. The circuit board 125 may also include one or more passive elements, conductive elements, or active elements such as those described above.

As previously noted, the package substrate 115 may include one or more conductive elements such as pads, traces, vias, etc. Signal path 150 depicts an example of one or more conductive elements. In some embodiments, the signal path may include one or more in-package waveguides such as striplines, surface or embedded microstrip lines, etc. Specifically, the signal path 150 may be coupled with one of interconnects 130 at one end, and the waveguide 145 at another end. The die 110 may be communicatively coupled with the signal path 150 by one of interconnects 130. In this manner, the interconnect 130 and the signal path 150 may communicatively couple the die 110 and the waveguide 145. Generally, in operation, the die 110 and particularly RF circuitry of the die 110 (which may also be referred to as a transceiver) may provide a high-speed electronic signal through interconnect 130 to signal path 150. The signal path 150 or the waveguide 145 may include a signal launcher which may convert the mode of the high-speed electromagnetic signal generated on-die 110 to another electromagnetic mode that matches the propagation characteristics of waveguide 145. The high-speed electromagnetic signal may then propagate along the waveguide 145 from one microelectronic package 105 to another. Generally, the signal launcher may include some form of antenna, parallel metal plates, stacked coupled patches, dipoles, microstrip-to-taper slot transitions, Vivaldi-type launchers, horn-type launchers, leaky-wave type of launchers or some other element which may convert and impedance-match the mode of an electromagnetic signal to a waveguide channel or vice versa.

It will be noted that FIG. 1 depicts one example configuration of a system, but other embodiments may have different configurations. For example, as noted, in some embodiments one or both of the microelectronic packages 105 may be coupled with the circuit board by interconnects 135 without the use of a socket 120. In some embodiments, the signal path 150 may include more or fewer parts or conductive elements than depicted in FIG. 1, or the conductive elements may be at a different part of the package substrate 115 (e.g., along the top of the package substrate 115). Additionally, the relative sizes or numbers of certain elements (e.g., the various interconnects, the height/width/length/etc. of the die 110, package substrate 115, socket 120, or circuit board 125, the number of dies 110 on a microelectronic package 105, etc.) may not be drawn to scale in FIG. 1, and so certain elements may be larger or smaller than depicted in FIG. 1. Additionally, although the two microelectronic packages 105 are depicted as generally being mirror images of one another, in other embodiments the microelectronic packages 105 may differ from one another in terms of number or size of one or more of the elements of the microelectronic packages 105, interconnects 135/140, or sockets 120. For example, in some embodiments one die 110 may be a processor and another die 110 may be a memory, and the two dies may be communicatively coupled by waveguide 145. In some embodiments, the die 110 may not be communicatively coupled with the waveguide 145 by signal path 150, and rather the die 110 may have an on-board signal launcher that is configured to launch an electromagnetic signal straight to the waveguide 145. Finally, it will be noted that although the waveguide 145 is depicted as generally linear, in some embodiments the waveguide 145 may be flexible and so may be non-linear.

Figure 2:
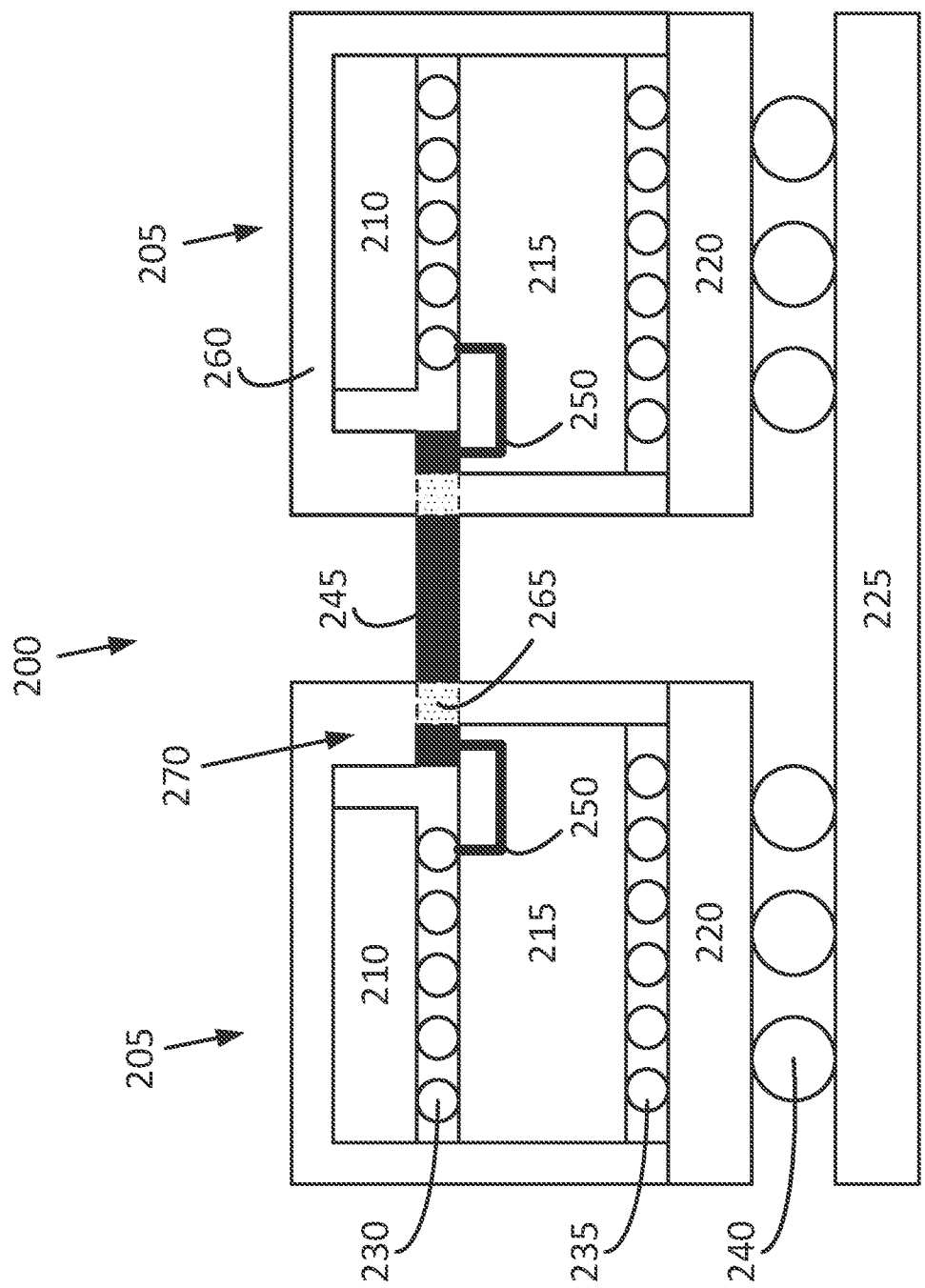
FIG. 2 depicts a simplified view of an alternate example system with a waveguide interconnect, in accordance with various embodiments herein.

FIG. 2 depicts a simplified view of an alternate example system with a waveguide interconnect, in accordance with various embodiments herein. Generally, the system 200 may include microelectronic packages 205 that include dies 210, interconnects 230, and package substrates 215, which may be similar to, and share one or more characteristics of, microelectronic packages 105, dies 110, interconnects 130, and package substrates 115 as depicted in FIG. 1. The dies 210 may be communicatively coupled with one another by signal paths 250 and waveguide 245, which may be respectively similar to, and share one or more characteristics of, signal paths 150 and waveguide 145 as depicted in FIG. 1. The system 200 may further include interconnects 235, sockets 220, interconnects 240, and circuit board 225, which may be respectively similar to, and share one or more characteristics of, interconnects 135, sockets 120, interconnects 140, and circuit board 125 as depicted in FIG. 1.

In embodiments, the socket 220 may include a top portion 260. Although depicted in FIG. 2 as a separate element, in some embodiments the socket 220 and the top portion 260 may be unitary. That is, the socket 220 and the top portion 260 may be a single physical element. The waveguide 245 may pass through the top portion 260 to couple with the package substrate 215 as shown at 265.

As can be seen in FIG. 2, the top portion 260 may generally couple with the microelectronic package 205, and particularly the die 210. By coupling the top portion 260 with the socket 220, the top portion 260 may exert pressure on the die 210, and secure the microelectronic package 205 to the socket 220. Additionally, the top portion 260 may include an extension 270. As shown, the extension 270 may be an area of the top portion 260 that is thicker than other elements of the top portion 260. The extension 270 may couple with the waveguide 245 and, when the top portion 260 is coupled with the socket 220, exert pressure on the waveguide 245 to secure the waveguide 245 to the package substrate 215.

It will be understood that this depiction of FIG. 2 is intended as an example embodiment, and other embodiments may have additional or alternative elements as described above with respect to FIG. 1.

Figure 3:
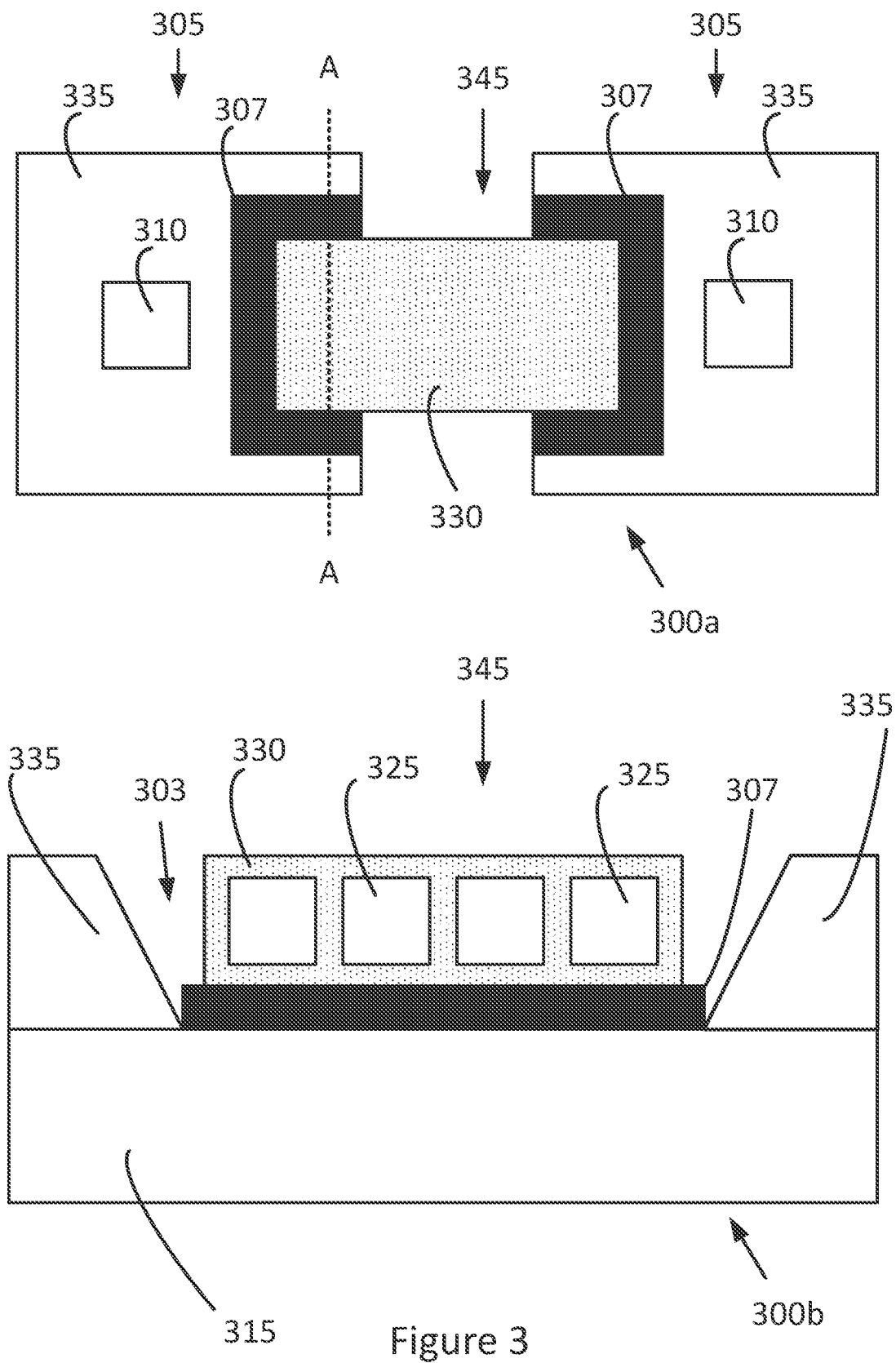
FIG. 3 depicts a simplified view of an example system with a waveguide interconnect, in accordance with various embodiments herein.

FIG. 3 depicts a simplified view of an example system with a waveguide interconnect, in accordance with various embodiments herein. It will be understood that FIG. 3 may include elements similar to those of FIG. 1 or 2. Additionally, FIG. 3 may in some ways be considered to present a more detailed view of certain elements than FIG. 1 or 2, and so may include elements not explicitly shown in FIG. 1 or 2. However, those elements (e.g., the solder resist layer or the adhesive) may still be present in some embodiments of FIG. 1 or 2.

Specifically, FIG. 3 depicts two views of a system 300*a* and 300*b* (collectively system 300). The view of system 300*a* may be considered to be a top-down view, and the view of the system 300*b* may be considered to be a cross-sectional view of the system 300*a* along line A-A. Generally, the system 300 may include two microelectronic packages 305 coupled by a waveguide 345, which may be respectively similar to, and shared one or more characteristics of, microelectronic packages 105 and waveguide 145 as depicted in FIG. 1. The system 300 may include a package substrate 315, which may be similar to, and share one or more characteristics of, package substrate 115 as depicted in FIG. 1. Respective microelectronic packages 305 may include one or more dies 310, which may be similar to, and share one or more characteristics of, dies 110 as depicted in FIG. 1.

The package substrate 315 may include a solder resist layer 335. The solder resist layer 335 may generally be at a "top" or "outer" portion of the package substrate 315 as shown. Generally, the solder resist layer 335 may be an epoxy material, a liquid photoimageable solder mask, a dry-film photoimageable solder mask, or some other type of material. The solder resist layer 335 may help prevent oxidation of the package substrate 315 or bridging of solder pads or other conductive elements of the system 300.

The solder resist layer 335 may include a cavity 303 as shown in FIG. 3. The waveguide 345 may be positioned in the cavity 303 and coupled with the package substrate 315. The cavity 303 may help with alignment or positioning of the waveguide 345. It will be understood that in some embodiments the dies 310 may also be positioned in a cavity of the solder resist layer 335, which may not be shown in FIG. 3. It will also be noted that although the sides of the cavity 303 are depicted as generally linear and sloped, in other embodiments the cavity 303 may have non-linear sides (e.g., curved), or the sides may be more sloped or less sloped than shown in FIG. 3, or not sloped at all.

Generally, the waveguide 345 may include a plurality of elements such as a dielectric layer 330 with one or more waveguide channels 325 positioned therein. The waveguide 345 may further include an adhesive material 307 (which may also be referred to as an attach film) that may couple the waveguide 345 to the package substrate 315. Details of the dielectric layer 330, the waveguide channels 345, and the adhesive material 307 may be given below. In some embodiments, the waveguide 345 may further include a metallic cladding layer, which may be described in further detail below. It will be noted that although the waveguide 345 and the adhesive material 307 are depicted as having generally a same z-height (e.g., vertical height with respect to the face of the package substrate 315 to which the adhesive material 307 is coupled) as the overall z-height of the solder resist layer 335, in other embodiments the solder resist layer 335 may be taller or shorter than the height of the waveguide 345 and the adhesive material 307.

More generally, the die 310 may include RF circuitry as described above, which may generate a high-speed electronic signal. The signal may propagate through one or more conductive elements as described above with respect to signal path 150 to the waveguide 345. In some embodiments, the conductive elements may utilize via transitions optimized for the bandwidth of the high-speed signal. Alternatively, the signal may be transferred through in-package waveguides to radiative elements constructed from the metal layers of the package interconnect stack. These radiative elements may be similar to the signal launchers described above. The waveguide 345 may be built directly on top of the signal launchers, or the waveguide 345 may be assembled and fixed in place using a retention mechanism such as a socket or adhesive such as adhesive material 307. The adhesive material 307 may be chosen carefully so that the adhesive material 307 may be removed if needed, and therefore allow serviceability of the system 300. In some embodiments, the adhesive material 307 may be chosen to be electromagnetically transparent to the high-speed electronic signal, so that adhesive material 307 may only minimally affect the propagation characteristics of the signal, or not affect the propagation characteristics at all.

As noted above, in another embodiment the waveguide 345 may be adjacent to the die 310. For example, in some embodiments the waveguide 345 may be directly adjacent to, and physically touching, the die 310. In other embodiments there may be a gap (on the order of approximately 10 micrometers or less) between the waveguide 345 and the die 310. In these embodiments, on-die signal launchers may feed the high-speed electromagnetic signal directly into the waveguide 345, and particularly into the waveguide channels 325 of the waveguide 345.

Other variations of FIG. 3 may be present in other embodiments. For example, rather than one single cavity 303 in which the waveguide 345 is positioned, in some embodiments the package substrate 315 may have one or more "grooves" or other mating features which may help align the waveguide 345 with the package substrate 315. In some embodiments, the adhesive material 307 may include one or more matching grooves or features which may further assist with aligning the waveguide 345 with the package substrate 315. Also, as described above with respect to FIG.

1, other embodiments may have variations in terms of number of elements, relative heights/widths/lengths/shapes, etc.

Generally, the dimensions of the waveguide 345 may depend on the dielectric material used for manufacture of the waveguide 345, frequency of operation of the overall system 300, or frequency of the high-speed electromagnetic signal that is to propagate through the waveguide. If the signal has a frequency of approximately 120 GHz, and the dielectric layer 330 has a dielectric constant of 6, then the waveguide 345 may have a width (as measured vertically with respect to the orientation of system 300a in FIG. 3) of approximately 800 microns and a height (as measured vertically with respect to the orientation of system 300b in FIG. 3) of approximately 400 microns. If the signal has a frequency of approximately 240 GHz and the dielectric layer 330 has a dielectric constant of 6, the waveguide 345 may have a width of approximately 400 microns and a height of approximately 200 microns. If the signal has a frequency of approximately 300 GHz and the dielectric layer 330 has a dielectric constant of 10, then the waveguide 345 may have a width of approximately 200 microns and a height of approximately 100 microns. If the signal has a frequency of approximately 600 GHz and the dielectric layer 330 has a dielectric constant of 10, the waveguide 345 may have a width of approximately 100 microns and a height of approximately 50 microns.

Additionally, it will be understood that although the waveguide 345 or the waveguide channels 325 are depicted as generally uniformly rectangular or square-shaped, in other embodiments the waveguide 345 or the waveguide channels 325 may have a different cross-sectional shape such as circular, oval, H-shaped, etc. The waveguide 345 or the waveguide channels 325 may be fully filled, partially filled, or hollow. In some embodiments, the waveguide 345 or the waveguide channels 325 may include a conductor within their cross-sectional shape, such as a ridge-based waveguide. Additionally, the waveguide 345 or the waveguide channels 325 may be a mono or multi-material structure.

Figure 4:
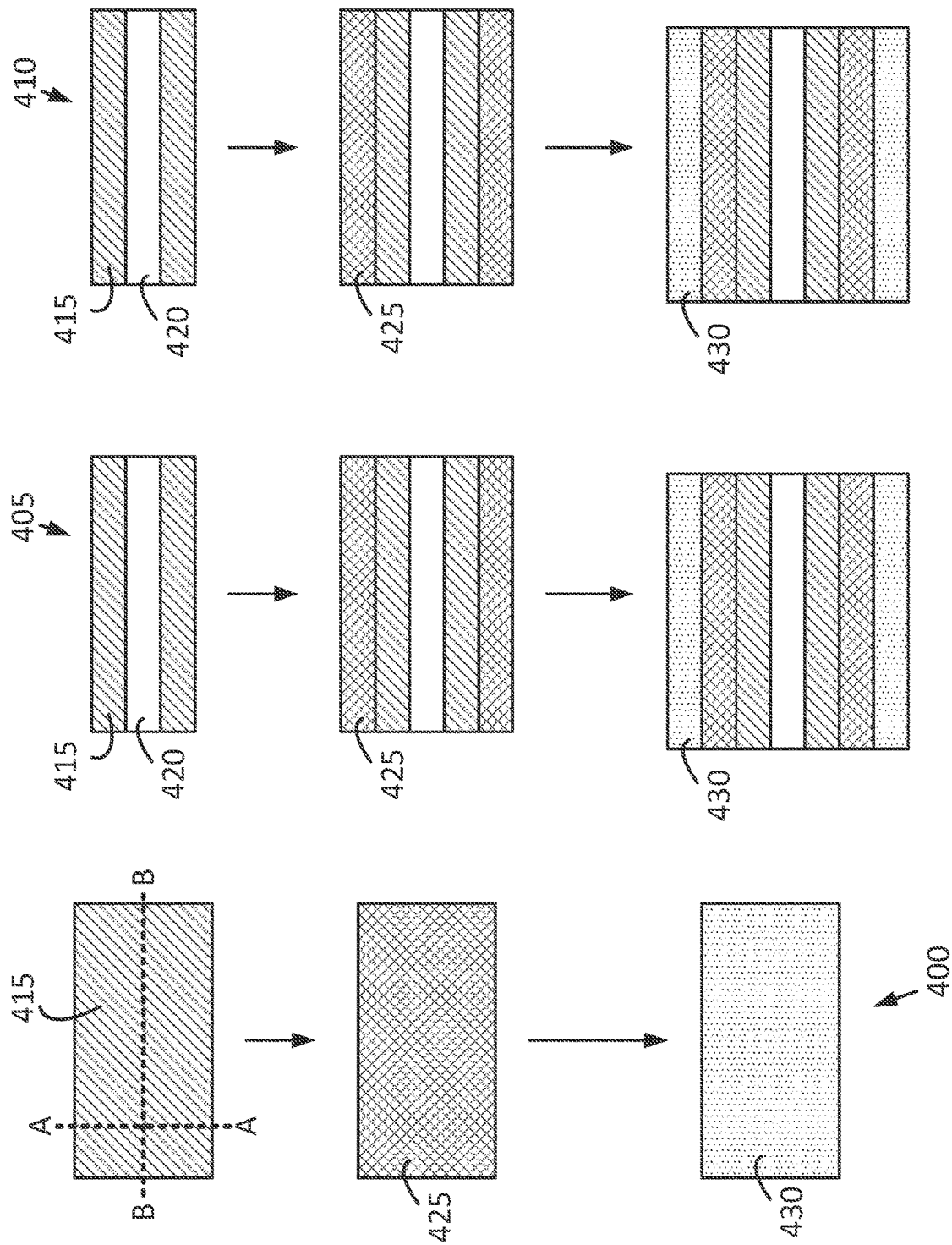
FIG. 4 depicts stages of manufacture of an example waveguide interconnect, in accordance with embodiments herein.
Figure 5:
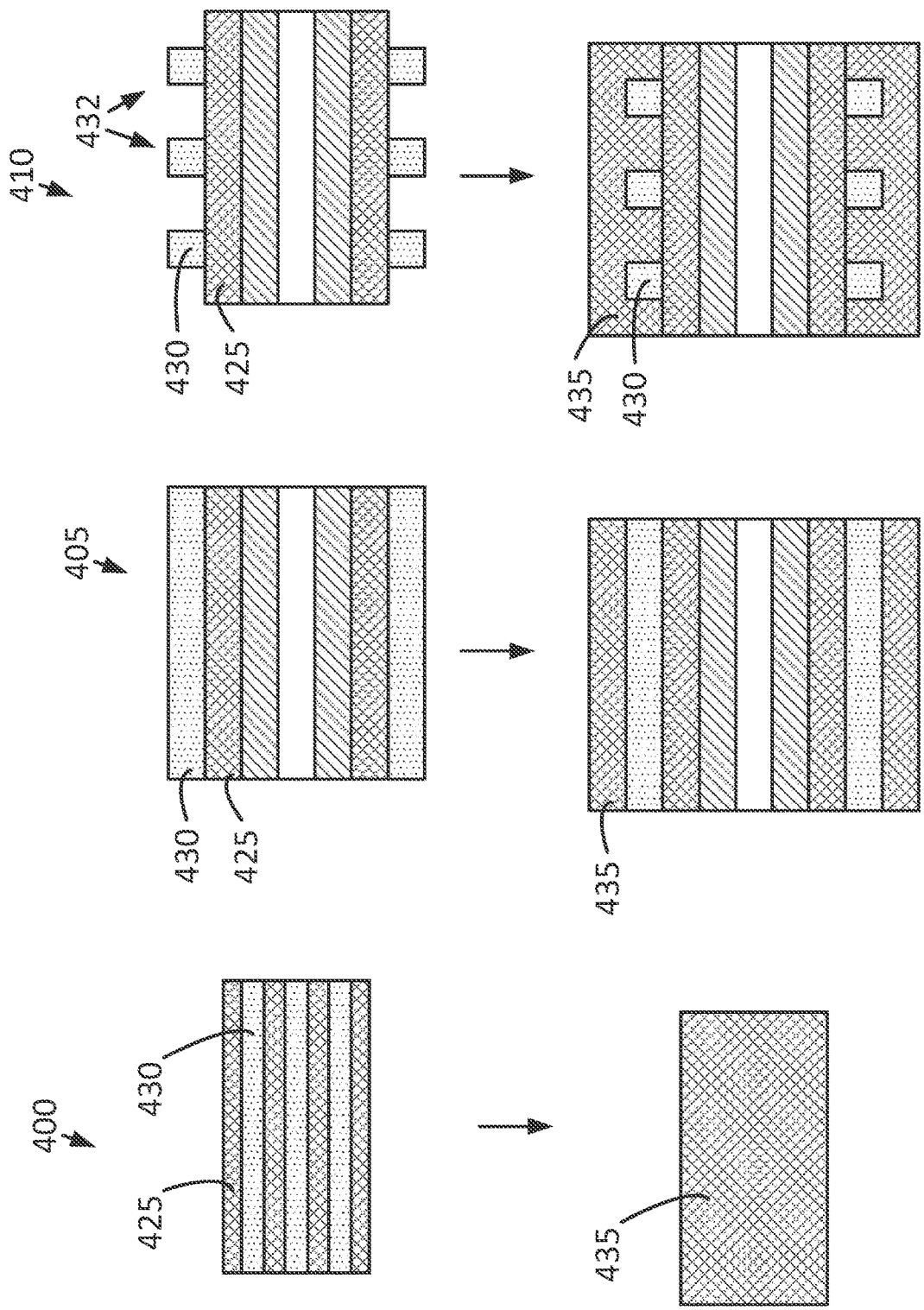
FIG. 5 depicts further stages of manufacture of the waveguide interconnect of FIG. 4, in accordance with embodiments herein.
Figure 6:
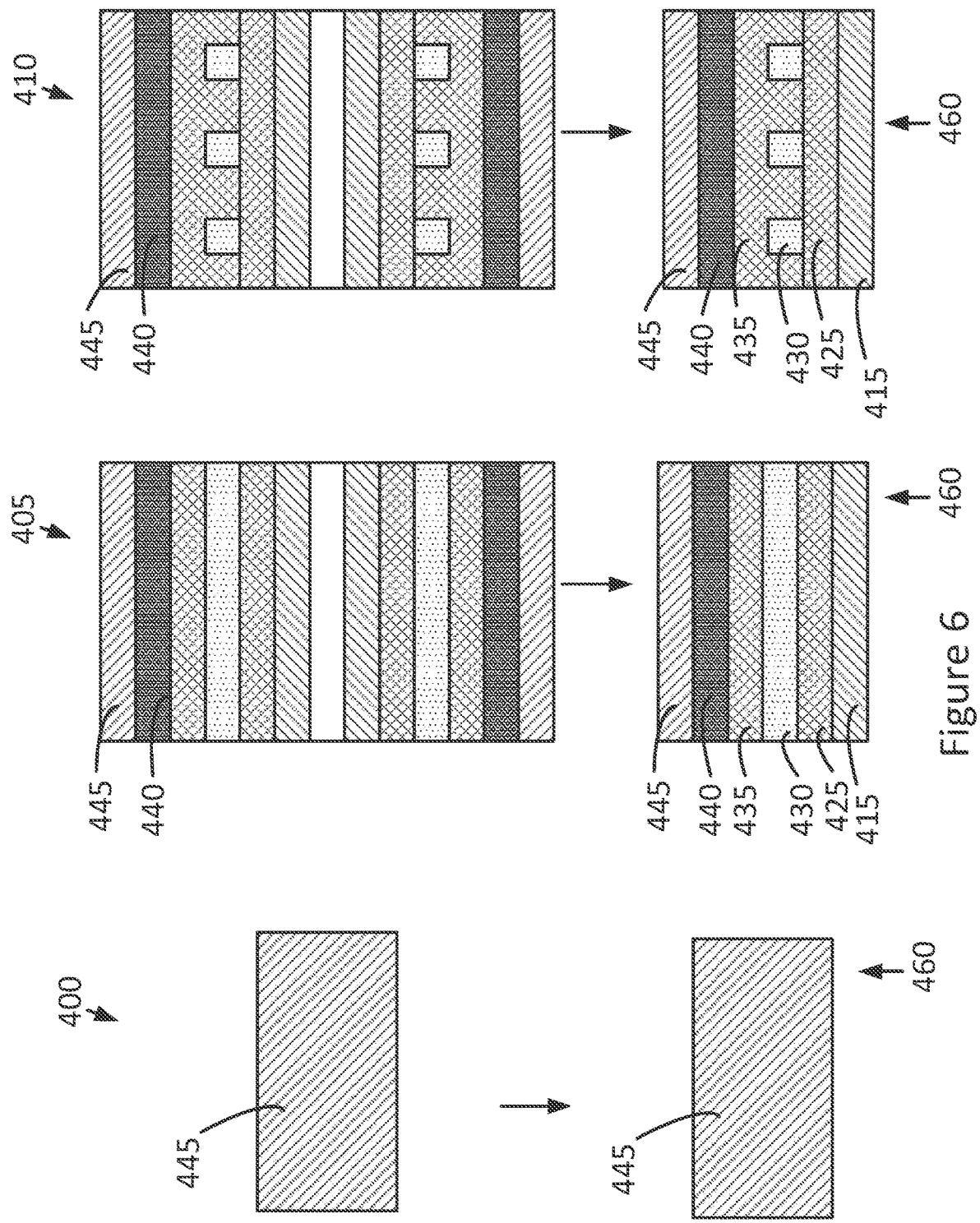
FIG. 6 depicts further stages of manufacture of the waveguide interconnect of FIG. 5, in accordance with embodiments herein.

FIGS. 4-6 illustrate stages of manufacture of an example waveguide interconnect, in accordance with embodiments herein. Generally, columns 400, 405, and 410 may illustrate different views of the manufacture. Each and every layer may not be repeatedly called out from stage to stage, but it may be understood that layers with identical shading from stage to stage may refer to the same layer even if not specifically enumerated each and every time. Column 400 may illustrate a "top" view of the various stages. Column 405 may illustrate a cut-away view along line B-B of column 400. Column 410 may illustrate a cut-away view along line A-A of column 400.

Generally, the process flow illustrated in FIGS. 4-6 may use a panel-level manufacturing flow as may be used for package substrates (such as package substrate 115 as depicted in FIG. 1). The reason for using a panel-based flow may be due to familiarity with the process flow and resultant manufacturing precision. In some situations, such as high-volume manufacturing (HVM), a roll-to-roll process may be used instead of a panel-based flow. In this case, the initial carrier may not be a copper-clad-laminate (CCL) panel, but rather a roll that includes an organic film carrier. Also, instead of use of a lithography process as may be described later for defining waveguide channels, printing processes such as gravure printing of dielectric materials may be used, which may reduce manufacturing costs.

Initially, the process may start with a carrier panel that has a so-called "peelable" core. The carrier panel may be referred to as a CCL panel. More specifically, the panel may have a structure of copper layers 415 (FIGS. 4 and 6) coupled with a core 420 (FIG. 4). The core 420 may be, for example, fiberglass-reinforced epoxy resins or some other material. At the end of the process, as will be described in greater detail below, the copper layers may be either thermally or mechanically separated from the core 420, releasing the layer/structure built onto the core 420. It will be noted that this process may be shown as a dual-sided process, however other embodiments may include only a single-sided process.

A dielectric cladding layer 425 may be positioned on the copper layer 415. In various embodiments, the dielectric cladding layer 425 may be, or may include PTFE-based materials, PE-based materials, LCP-based materials, cyclic olefin copolymer (CoC)-based materials, low temperature co-fired ceramic (LTCC)-based materials, silicon-dioxide ($SiO_2$)-based materials, some other material, or some combination thereof. The dielectric cladding layer 425 may be a foamed or porous material based on the material mentioned above. The dielectric cladding layer 425 may be laminated on the copper layer 415, or it may be deposited on the copper layer 415 in some other manner. Generally, the dielectric cladding layer 425 may be similar to the material used for the dielectric layer 330 as depicted in FIG. 3.

A waveguide dielectric material 430 may then deposited on the dielectric cladding layer 425. The waveguide dielectric material 430 may be deposited on the dielectric cladding layer 425 through, for example, lamination. Generally, the waveguide dielectric material 430 may be similar to the material used for waveguide channels 325 as depicted in FIG. 3. The waveguide dielectric material 430 may, in some embodiments, be a photoimageable dielectric material such as polyimide, epoxide filled with photo-activated cross-linkers, or some other photoimageable dielectric material. In other words, the waveguide dielectric material 430 may react to exposure to light and therefore may be dispositioned for optical patterning through, for example, use of a laser, a mask, etc.

The process flow may then continue to FIG. 5 where the waveguide dielectric material 430 may be patterned to form waveguide channels 432 similar to those of waveguide channels 325 as depicted in FIG. 3. As described above, the waveguide dielectric material 430 may be photoimageable and therefore exposure to light of a certain wavelength or intensity may cause a change in the dielectric material 430. By using a specific light at a specific point, or by exposure to the light through a mask, portions of the waveguide dielectric material 430 may be removed to leave the resultant waveguide channels 432 and expose the dielectric cladding layer 425 as shown in FIG. 5. A cleaning process such as chemical cleaning, physical scrubbing, etc. may be further performed subsequent to the imaging to remove any additional waveguide dielectric material 430 that may be left behind. It will be understood that although the waveguide dielectric material 430 is described as photoimageable, and the patterning is described as optical patterning or optical etching, in other embodiments the waveguide dielectric material 430 may not be photoimageable and the waveguide dielectric material 430 may be patterned using a different process such as chemical etching, mechanical etching, etc. It will be noted that although three waveguide channels 432 are depicted in FIG. 5, in other embodiments the waveguide dielectric material 430 may be patterned to only include a single waveguide channel, or some other number of waveguide channels than depicted in FIG. 5.

An additional dielectric cladding layer 435 may then be deposited over the waveguide dielectric material 430 and the dielectric cladding layer 425 as shown in FIG. 5. As can be seen, the additional dielectric cladding layer 435 and the dielectric cladding layer 425 may together generally surround, and seal, the waveguide dielectric layer 430. In embodiments, the additional dielectric cladding layer 435 may be the same material as dielectric cladding layer 425, whereas in other embodiments the additional dielectric cladding layer 435 may be a different type of dielectric such as a different type of PTFE-based dielectric, PE-based dielectric, LCP-based dielectric, or some other type of dielectric material or porous/foamed dielectric material.

As shown in FIG. 6, an adhesive layer 440 may then be positioned on the additional dielectric cladding layer 435. The adhesive layer 440 may in some embodiments be considered to be an adhesive film. The adhesive layer 440 may be positioned on the additional dielectric cladding layer 435 by deposition, lamination, physically placing the adhesive layer 440 on the additional dielectric cladding layer 435, etc. In embodiments, the adhesive layer 440 may be or include siloxane-based adhesives, acrylic-based adhesives, or some adhesive as may be used in self-adhesive films.

A carrier layer 445 may then be positioned on the adhesive layer 440. The carrier layer 445 may be, for example mylar, kapton, polyethylene terephthalate (PET), polyethylene (PE), or some other material. Generally, the carrier layer 445 may be removably adhered to the adhesive layer 440 such that the carrier layer 445 may be removed from the adhesive layer 440 when the resultant waveguide is to be coupled with a package substrate.

The resultant layers may then be removed from the core 420 (FIG. 4) to form a waveguide 460 as depicted in FIG. 6. Generally, the waveguide 460 may be considered to be a relatively detailed depiction of a waveguide such as waveguide 345 as depicted in FIG. 3. Specifically, the waveguide 460 may include the carrier layer 445, the adhesive layer 440, the additional dielectric cladding layer 435, the waveguide dielectric layer 430, the dielectric cladding layer 425, and the copper layers 415. Generally, removal of the waveguide 460 from the core 420 may then be followed with cutting or other patterning to cut the waveguide to a desired size with respect to length, width, or height.

It will be noted that, as depicted in FIG. 6, the waveguide 460 may be considered to be in a transportable form. When the waveguide 460 is to be coupled with a package substrate, for example as depicted in FIG. 3, the waveguide 460 may be inverted and the carrier layer 445 and the copper layer 415 may be removed. For example, the carrier layer 445 or the copper layer 415 may be removed by peeling, scrubbing, chemical or optical etching, etc. The adhesive layer 440 may then be coupled with the package substrate as depicted in FIG. 3. It will also be understood that in some embodiments the waveguide 460 may be transported still coupled with the core 420, and then be removed from the core 420 at a different location.

It will be understood that the various stages of development or manufacture depicted in FIGS. 4-6 are intended as examples of one embodiment, and other embodiments may vary. For example, in some embodiments the adhesive layer 440 may be coupled with the carrier layer 445 before the adhesive layer 440 is coupled with the additional dielectric cladding layer 435. Other stages may occur in a different order than depicted, or multiple stages may occur concurrently with one another. Additionally, it will be understood that the relative dimensions shown in FIGS. 4-6 may be depicted for the sake of illustration, and various elements may be thicker/thinner/shorter/wider/longer/narrower/etc. than depicted with respect to one another. Other embodiments may vary in one or more other ways than depicted in the Figures.

Figure 7:
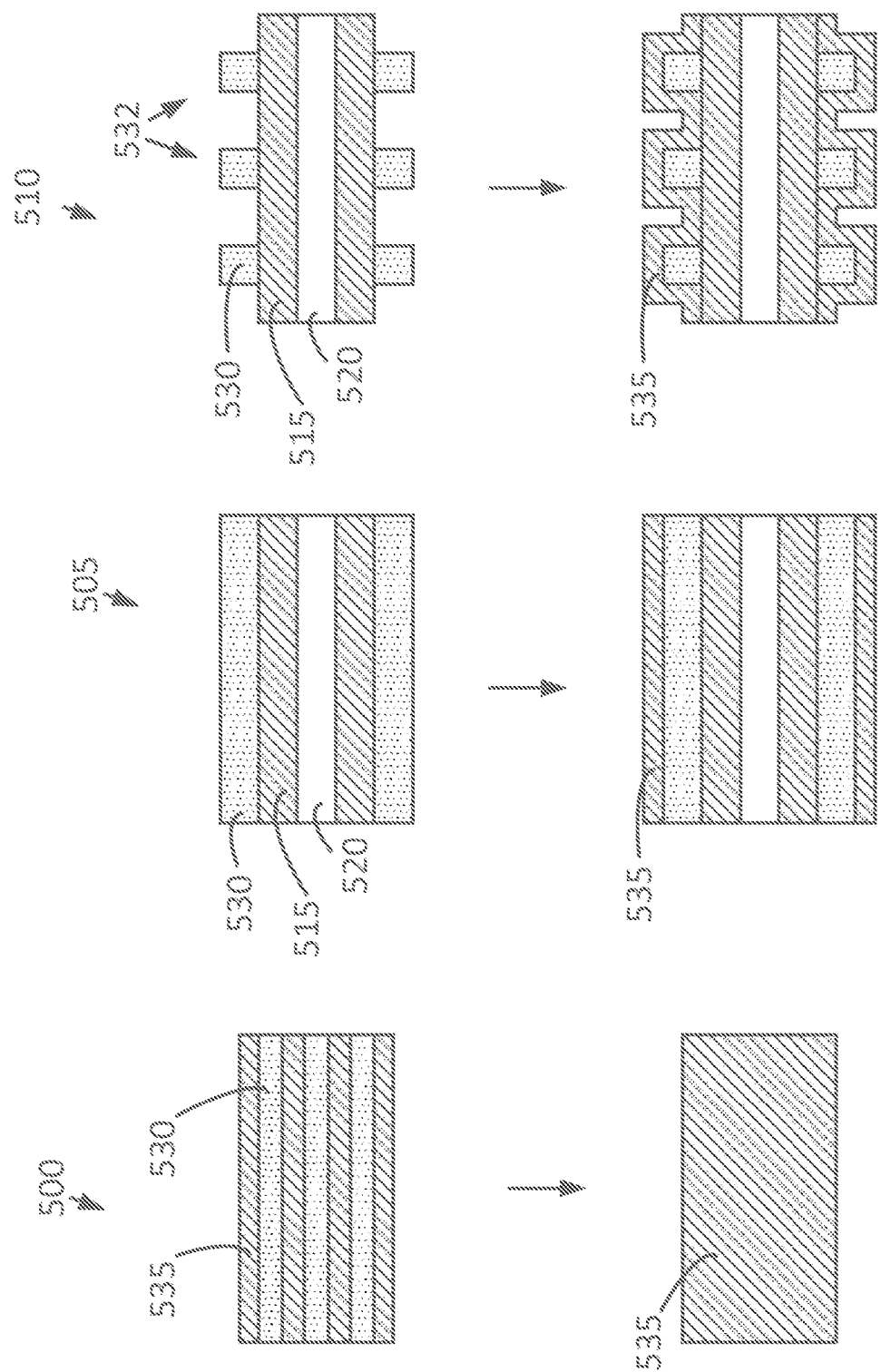
FIG. 7 depicts stages of manufacture of an example waveguide interconnect, in accordance with embodiments herein.
Figure 8:
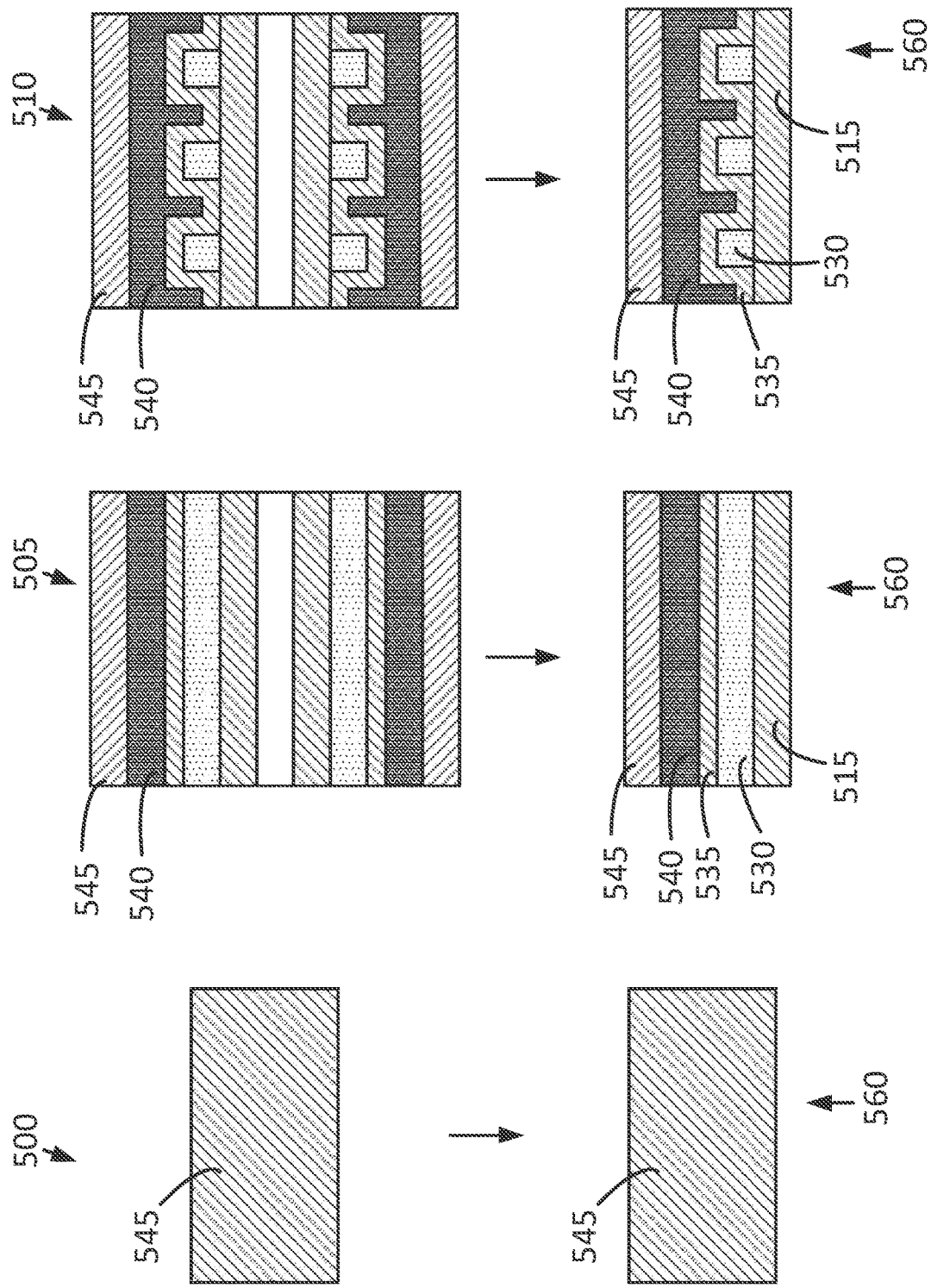
FIG. 8 depicts further stages of manufacture of the waveguide interconnect of FIG. 7, in accordance with embodiments herein.

FIGS. 7 and 8 depict depicts stages of manufacture of an alternative example waveguide interconnect, in accordance with embodiments herein. Specifically, the waveguide 460 may be considered to be a "dielectric-clad" waveguide. By contrast, the waveguide resultant from the stages of FIGS. 7 and 8 may be considered to be a "metal-clad" waveguide.

Generally, FIGS. 7 and 8 may include a "top" view column 500 and side-cut-away view columns 505 and 510 which may be respectively similar to columns 400, 405, and 410 as depicted in FIGS. 4-6. Certain initial stages may not be depicted as they may already be described with respect to FIG. 4. As shown in FIG. 7, the stage may include a core 520, copper layer 515, and waveguide dielectric material 530 which may be respectively similar to, and share one or more characteristics of, core 420, copper layer 415, and waveguide dielectric material 430. The waveguide dielectric material 430 may be patterned to form waveguide channels 532, as described above.

A copper cladding layer 535 may then be positioned over the copper layer 515 and the waveguide dielectric material 530 as shown. The copper cladding layer 535 may, for example, be deposited, plated, etc. It will be noted that although the copper cladding layer 535 is depicted in FIG. 7 as having one or more lateral "gaps" or "voids," in some embodiments the copper cladding layer 535 may not have any gaps or voids and may generally fill the space between the waveguide dielectric material 530.

Subsequently, as shown in FIG. 8, an adhesive layer 540 and a carrier layer 545 may then be positioned over the copper cladding layer. The adhesive layer 540 and the carrier layer 545 may be respectively similar to, and share one or more characteristics of, adhesive layer 440 and carrier layer 445 as depicted in FIG. 6. As shown, the adhesive layer 540 may fully fill the spaces between the copper cladding layer 535, however in other embodiments the adhesive layer 540 may not fill the spaces between the copper cladding layer 535, or may only partially fill the spaces between the copper cladding layer 535.

The various layers may then be removed from core 520 (FIG. 7) to form waveguide 560 as described above with respect to waveguide 460 as depicted in FIG. 6. Specifically, the waveguide 560 may include carrier layer 545, adhesive layer 540, copper cladding layer 535, waveguide dielectric material 530, and copper layer 515. As described above, removal of the waveguide 560 from the core 520 may be followed by further processes such as cutting, shaping, etc. in one or more dimensions. Additionally, it will be noted that because the waveguide dielectric material 530 is generally surrounded by copper layer 515 and copper cladding layer 535, when the waveguide 560 is removed from the core 520 it may be desirable to do so in such a way that the copper layer 515 is maintained so that the waveguide dielectric material 530 remains generally surrounded.

As described above with respect to FIGS. 4-6, it will be understood that FIGS. 7 and 8 are intended as one example embodiment, and other embodiments may include one or more variations. For example, various stages may be performed in a different order, or concurrently with one another. Various elements may have different dimensions than depicted, or there may be a different number of elements such as only a single waveguide channel, or some other number of waveguide channels than depicted. In some embodiments, the described copper elements may be replaced by, or include, other suitable electrically conductive materials or a combination thereof, such as silver or gold.

Figure 9:
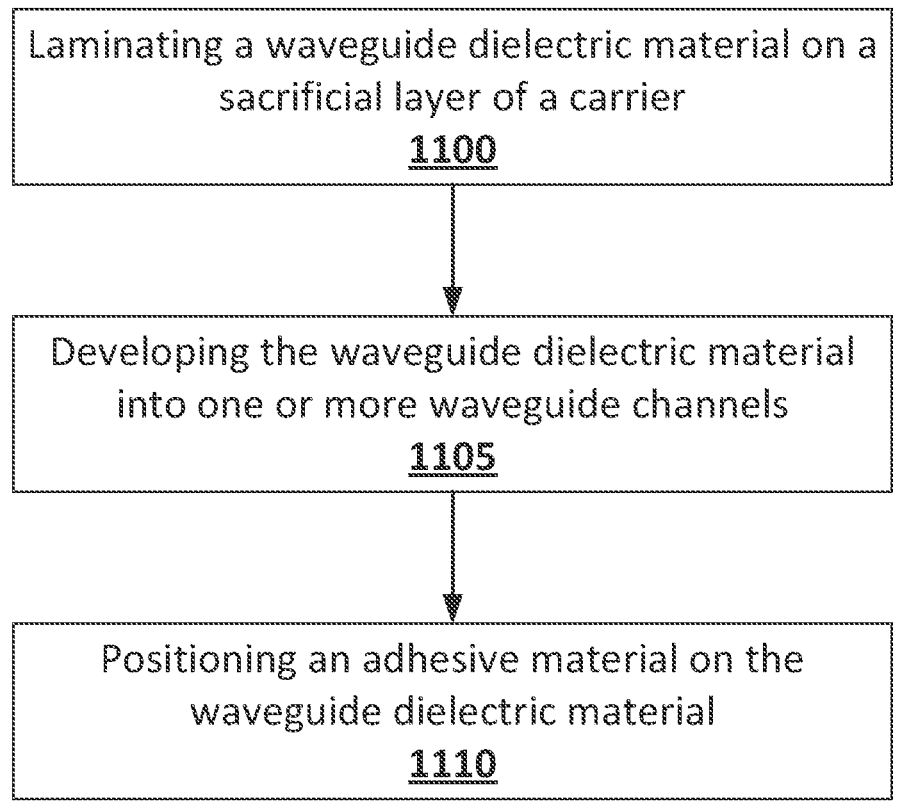
FIG. 9 depicts an example technique for manufacturing a waveguide interconnect, in accordance with embodiments herein.

FIG. 9 depicts an example technique for manufacturing a waveguide interconnect, in accordance with embodiments herein. The technique may include laminating, at 1100, a waveguide dielectric material on a sacrificial layer of a carrier. The waveguide dielectric material may be similar to, for example, waveguide dielectric materials 430 (FIG. 5) or 530 (FIG. 7). The sacrificial layer may be similar to, for example, copper layers 415 (FIG. 5) or 515 (FIG. 7). In some embodiments, the waveguide dielectric material may be laminated directly onto the copper layer, for example as depicted with respect to waveguide dielectric material 530 and copper layer 515. In other embodiments, an additional layer such as a dielectric cladding layer may be present such as is shown with respect to waveguide dielectric material 430, copper layer 415, and dielectric cladding layer 425 as depicted in FIG. 5.

The technique may further include developing, at 1105, the waveguide dielectric material into one or more waveguide channels. The waveguide channels may be similar to, for example, waveguide channels 325 (FIG. 3), 432 (FIG. 5), or 532 (FIG. 7). As described above, the waveguide channels may be developed by optical etching, chemical etching, mechanical etching, or some other technique or process.

The technique may further include positioning, at 1110, an adhesive material on the waveguide dielectric material. The adhesive material may be similar to, for example, adhesive layer 440 or 540. As described above, an additional layer such as a waveguide dielectric material or a metal cladding layer may be positioned between the adhesive material and the waveguide dielectric material. It will be understood that this described technique is intended as one example technique, and other embodiments may include additional elements.

Figure 10:
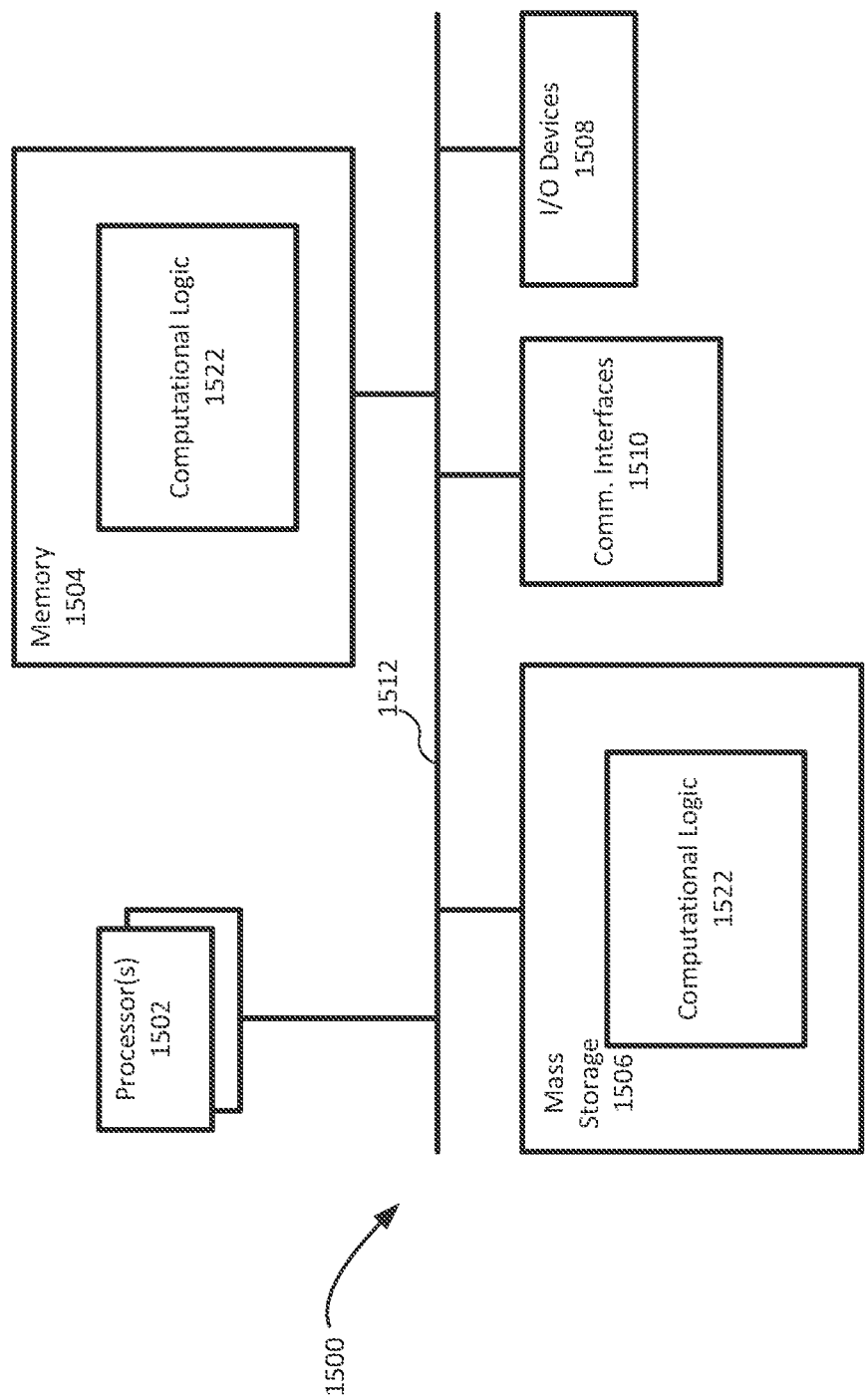
FIG. 10 illustrates an example device that may use various embodiments herein, in accordance with various embodiments.

FIG. 10 illustrates an example computing device 1500 suitable for use with various of the systems such as systems 100 or 200, in accordance with various embodiments. Specifically, in some embodiments, the computing device 1500 may include one or more of systems 100 or 200 therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid-state mass storage, and so forth. Volatile memory may include, but is not limited to, static and/or DRAM. Non-volatile memory may include, but is not limited to, electrically erasable programmable read-only memory, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, the buses may be bridged by one or more bus bridges (not shown). Each of these elements may perform respective conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone, and are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra-mobile PC, a mobile phone, or a digital camera. In further implementations, the computing device 1500 may be any other electronic device that processes data.

In some embodiments, as noted above, computing device 1500 may include one or more of systems 100 or 200. Specifically, various of the dies 110, 210, etc. may be an element of the computing device such as a processor 1502, memory 1504, mass storage 1506, etc.

EXAMPLES OF VARIOUS EMBODIMENTS

Example 1 includes a semiconductor package to be used in an electronic device, wherein the semiconductor package includes: a first package substrate coupled with a die, wherein the first package substrate includes one or more layers of a dielectric material; and a waveguide coupled with the first package substrate, wherein the waveguide includes: two or more layers of a dielectric material; and a waveguide channel positioned between two layers of the two or more layers of the dielectric material, wherein the waveguide channel is to convey an electromagnetic signal with a frequency greater than 30 gigahertz (GHz).

Example 2 includes the semiconductor package of example 1, wherein the waveguide includes one or more waveguide channels.

Example 3 includes the semiconductor package of example 1, wherein the die is a first die, and further comprising a second package substrate coupled with a second die, and wherein the waveguide is coupled with the second package substrate.

Example 4 includes the semiconductor package of example 3, wherein the waveguide is to communicatively couple the first die with the second die.

Example 5 includes the semiconductor package of any of examples 1-4, wherein the package substrate includes one or more alignment mechanisms to align the waveguide with a signal launcher of the die.

Example 6 includes the semiconductor package of example 5, wherein the one or more alignment mechanisms include a solder resist groove that is to couple with, and align, the waveguide.

Example 7 includes the semiconductor package of any of examples 1-4, wherein the waveguide is to receive the electromagnetic signal from a signal launcher of the first package substrate.

Example 8 includes the semiconductor package of any of examples 1-4, wherein the waveguide is to receive the electromagnetic signal from a signal launcher of the die.

Example 9 includes a computing device comprising: a first package substrate coupled with a first die; a second package substrate coupled with a second die; and a waveguide coupled with the first package substrate and the second package substrate, wherein the waveguide includes: a plurality of layers of a dielectric material; and a waveguide channel positioned between two layers of the dielectric material, wherein the waveguide channel is to convey an electromagnetic signal with a frequency greater than 30 gigahertz (GHz) between the first die and the second die.

Example 10 includes the computing device of example 9, wherein the dielectric material is a dielectric cladding material.

Example 11 includes the computing device of example 9, wherein the plurality of layers of the dielectric material includes a metal cladding layer.

Example 12 includes the computing device of any of examples 9-11, wherein the waveguide channel is a first waveguide channel, and wherein the waveguide further includes a second waveguide channel positioned between the two layers of the dielectric material, wherein the second waveguide channel is to convey an electromagnetic signal with a frequency greater than 30 GHz.

Example 13 includes the computing device of any of examples 9-11, wherein the electromagnetic signal has a frequency greater than 300 GHz.

Example 14 includes the computing device of any of examples 9-11, wherein the waveguide includes an adhesive material that is to attach to the package substrate to couple the waveguide with the package substrate.

Example 15 includes a method of forming a waveguide that is to be coupled with a package substrate of a semiconductor package, wherein the method comprises: laminating a waveguide dielectric material on a sacrificial layer of a carrier; developing the waveguide dielectric material into one or more waveguide channels; and positioning an adhesive material on the waveguide dielectric material.

Example 16 includes the method of example 15, wherein the sacrificial layer includes copper.

Example 17 includes the method of example 15, further comprising: positioning a carrier film on the adhesive material; and removing the carrier subsequent to the positioning the carrier film on the adhesive material.

Example 18 includes the method of any of examples 15-17, further comprising plating copper directly onto the waveguide dielectric material subsequent to the developing of the waveguide dielectric material.

Example 19 includes the method of any of examples 15-17, further comprising laminating a cladding dielectric directly onto the sacrificial layer of the carrier; and laminating the waveguide dielectric directly onto the cladding dielectric.

Example 20 includes the method of example 19, wherein the cladding dielectric is a first cladding dielectric, and further comprising laminating a second cladding dielectric directly onto the waveguide dielectric material; and laminating the adhesive material directly onto the second cladding dielectric.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A semiconductor package to be used in an electronic device, wherein the semiconductor package includes:
a first package substrate coupled with a die, wherein the first package substrate includes one or more layers of a dielectric material and one or more alignment mechanisms to align a waveguide with a signal launcher of the die, wherein the one or more alignment mechanisms include a solder resist cavity that is to couple with, and align, the waveguide; and
the waveguide coupled with the first package substrate, wherein the waveguide includes:
two or more layers of a dielectric material; and
a waveguide channel positioned between two layers of the two or more layers of the dielectric material, wherein the waveguide channel is to convey an electromagnetic signal with a frequency greater than 300 gigahertz (GHz).

2. The semiconductor package of claim 1, wherein the waveguide channel is one of a plurality of waveguide channels.

3. The semiconductor package of claim 1, wherein the die is a first die, and further comprising a second package substrate coupled with a second die, and wherein the waveguide is coupled with the second package substrate.

4. The semiconductor package of claim 3, wherein the waveguide is to communicatively couple the first die with the second die.

5. The semiconductor package of claim 1, wherein the waveguide is to receive the electromagnetic signal from the signal launcher of the die.

6. A semiconductor package to be used in an electronic device, wherein the semiconductor package includes:
a first package substrate coupled with a die, wherein the first package substrate includes one or more layers of a dielectric material; and
a waveguide coupled, by an adhesive, with the first package substrate, wherein the waveguide includes:
two or more layers of a dielectric material; and
a waveguide channel positioned between two layers of the two or more layers of the dielectric material, wherein the waveguide channel is to convey an electromagnetic signal with a frequency greater than 30 gigahertz (GHz).

7. A computing device comprising:
a first package substrate coupled with a first die;
a second package substrate coupled with a second die; and
a waveguide coupled, by an adhesive, with the first package substrate and the second package substrate, wherein the waveguide includes:
a plurality of layers of a dielectric material; and
a waveguide channel positioned between two layers of the plurality of the layers of the dielectric material, wherein the waveguide channel is to convey an electromagnetic signal with a frequency greater than 30 gigahertz (GHz) between the first die and the second die.

8. The computing device of claim 7, wherein the waveguide channel is a first waveguide channel, and wherein the waveguide further includes a second waveguide channel positioned between the two layers of the dielectric material, wherein the second waveguide channel is to convey the electromagnetic signal with the frequency greater than 30 GHz.

9. The computing device of claim 7, wherein the plurality of layers of the dielectric material includes a metal cladding layer.

10. The computing device of claim 7, wherein the dielectric material is a dielectric cladding material.

11. A method of forming a waveguide that is to be coupled with a package substrate of a semiconductor package, wherein the method comprises:
laminating a waveguide dielectric material on a sacrificial layer of a carrier;
developing the waveguide dielectric material into one or more waveguide channels; and
positioning an adhesive material on the waveguide dielectric material.

12. The method of claim 11, further comprising laminating a cladding dielectric directly onto the sacrificial layer of the carrier; and
laminating the waveguide dielectric directly onto the cladding dielectric.

13. The method of claim 12, wherein the cladding dielectric is a first cladding dielectric, and further comprising laminating a second cladding dielectric directly onto the waveguide dielectric material; and
laminating the adhesive material directly onto the second cladding dielectric.

14. The method of claim 11, further comprising plating copper directly onto the waveguide dielectric material subsequent to the developing of the waveguide dielectric material.

15. The method of claim 11, further comprising:
positioning a carrier film on the adhesive material; and
removing the carrier subsequent to the positioning the carrier film on the adhesive material.

16. The method of claim 11, wherein the sacrificial layer includes copper.

* * * * *